United States Patent
Hsiao

(10) Patent No.: US 9,443,604 B2
(45) Date of Patent: Sep. 13, 2016

(54) ELECTRONIC DEVICE AND DATA-MANAGEMENT METHOD THEREOF

(71) Applicant: Silicon Motion, Inc., Jhubei, Hsinchu County (TW)

(72) Inventor: Li-Shuo Hsiao, Zhudong Township, Hsinchu County (TW)

(73) Assignee: SILICON MOTION, INC., Jhubei, Hsinchu County (TW)

( * ) Notice: Subject to any disclaimer, the term of this patent is extended or adjusted under 35 U.S.C. 154(b) by 0 days.

(21) Appl. No.: 14/568,529

(22) Filed: Dec. 12, 2014

(65) Prior Publication Data

US 2015/0187429 A1  Jul. 2, 2015

(30) Foreign Application Priority Data

Dec. 31, 2013  (TW) .............................. 102149201 A

(51) Int. Cl.
| | |
|---|---|
| G11C 7/00 | (2006.01) |
| G11C 16/34 | (2006.01) |
| G11C 16/10 | (2006.01) |
| G11C 29/52 | (2006.01) |
| G11C 29/00 | (2006.01) |

(52) U.S. Cl.
CPC ........... *G11C 16/3418* (2013.01); *G11C 16/10* (2013.01); *G11C 29/52* (2013.01); *G11C 29/74* (2013.01); *G11C 29/883* (2013.01)

(58) Field of Classification Search
CPC .............................. G11C 29/04; G11C 29/702
USPC .................................................. 365/200, 201
See application file for complete search history.

(56) References Cited

U.S. PATENT DOCUMENTS

| | | | |
|---|---|---|---|
| 7,721,146 B2 | 5/2010 | Polisetti et al. | |
| 2008/0112224 A1 | 5/2008 | Lee et al. | |
| 2011/0055623 A1* | 3/2011 | Kim ....................... | G06F 11/141 714/710 |
| 2013/0054873 A1* | 2/2013 | Belluomini ......... | G06F 12/0866 711/103 |
| 2014/0310573 A1* | 10/2014 | Mao .................... | G06F 11/1068 714/773 |

* cited by examiner

*Primary Examiner* — Han Yang
(74) *Attorney, Agent, or Firm* — McClure, Qualey & Rodack, LLP

(57) ABSTRACT

An exemplary embodiment provides an electronic device including a controller, a first flash memory and a second flash memory. The first flash memory stores a first data sector. The second flash memory stores a second data sector, wherein the first data sector and the second data sector are the same, and the first data is stored in a plurality of pages of the first flash memory and the second data is stored in a plurality of pages of the second flash memory. The controller produces a third data according to the first data sector and the second data sector when the controller determines that the first data sector stored in the first flash memory is damaged.

24 Claims, 4 Drawing Sheets

ELECTRONIC DEVICE AND DATA-MANAGEMENT METHOD THEREOF

CROSS REFERENCE TO RELATED APPLICATIONS

This Application claims priority of Taiwan Patent Application No. 102149201, filed on Dec. 31, 2013, the entirety of which is incorporated by reference herein.

BACKGROUND OF THE INVENTION

1. Field of the Invention

The present invention relates to a data storage device, and in particular to a method for managing flash memory.

2. Description of the Related Art

Flash memory is considered a non-volatile data-storage device, using electrical methods to erase and program itself. Taking NAND Flash as an example, it is often used in memory cards, USB flash devices, solid state devices, eMMC and other uses. The manufacturing cost of the flash memory is lower than the electrically erasable programmable read-only memory (EEPROM), such that flash memory has become the main product on the market. Furthermore, flash memory can be applied to handheld computers (PDA), notebook computers, digital music players, digital cameras, and mobile phones, etc.

Flash memory includes a plurality of blocks. Each of the blocks includes a plurality of pages for storing data. Data in the flash memory is erased in units of one block, and data in the flash memory is programmed by units of one page. Namely, when data in the flash memory is required to be erased, all of the data stored in the pages of a block will be erased. The data of the flash memory can be written into the pages. When a part of pages of a block needs to be updated, the new data cannot be written into the part of the pages, because the pages are occupied by the old data.

BRIEF SUMMARY OF THE INVENTION

A detailed description is given in the following embodiments with reference to the accompanying drawings.

An exemplary embodiment provides an electronic device including a controller, a first flash memory and a second flash memory. The first flash memory stores a first data sector. The second flash memory stores a second data sector, wherein the first data sector and the second data sector are the same, and the first data is stored in a plurality of pages of the first flash memory and the second data is stored in a plurality of pages of the second flash memory. The controller produces a third data according to the first data sector and the second data sector when the controller determines that the first data sector stored in the first flash memory is damaged.

Another exemplary embodiment provides an electronic device including a controller and a flash memory. The flash memory includes a first block and a second block, the first block stores a first data sector, the second block stores a second data sector that is the same as the first data, wherein the controller produces a third data according to the first data sector and the second data sector upon determining that the first data sector is damaged.

Another exemplary embodiment provides a data-management method applied to an electronic device. The data-management method includes: storing a first data sector and a second data sector, wherein the first data sector and the second data sector are the same; and determining whether the first data sector is damaged at a specific time or after a specific event; and producing a third data sector according to the first data and the second data sector when the first data sector is damaged.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Flash memory is widely used in eMMC for booting systems, but the ISP code and the Info data sector of eMMC will be damaged by the hit of soldering. The present invention provides a structure for storing a plurality of ISP codes and Info data sectors in the flash memory, wherein the pages arranged to store the ISP codes and the Info data sectors are protected by Error Checking and Correcting (ECC), and the controller is configured to check whether any of the pages are damaged and to recover the damaged ISP codes and the damaged Info data sectors by the undamaged ISP codes and the undamaged Info data sectors.

Figure 1:
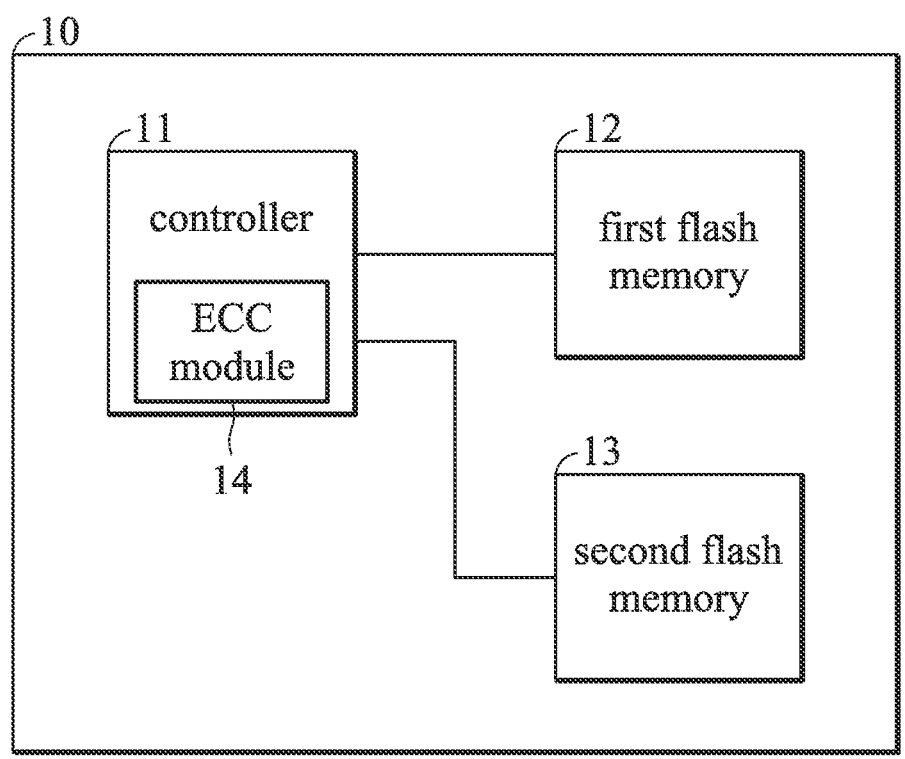
FIG. 1 is a schematic diagram illustrating an embodiment of an electronic device of an exemplary embodiment.

FIG. 1 is a schematic diagram illustrating an embodiment of an electronic device of an exemplary embodiment. The electronic device 10 includes a controller 11, a first flash memory 12 and a second flash memory 13. The first flash memory 12 stores ISP codes and Info data sectors. The second flash memory 13 stores the ISP codes and Info data sectors which are the same as the ISP codes and Info data sectors stored in the first flash memory 12. The controller 11 reads the ISP codes and the Info data sectors stored in the first flash memory 12 to determine whether any of the ISP codes and the Info data sectors are damaged at a specific time or after a specific event. In this embodiment, the specific time can be the time that the electronic device is turned on, powered on, or returns from standby mode. In another embodiment, the specific time can be the time after the electronic device passes is soldered, or reboots after crashing. In this embodiment, the specific event can be the process of soldering the PCB board or the electronic device crashing. It should be noted that, in one embodiment, the controller 11 determines whether the ISP codes and the Info data sectors stored in the first flash memory 12 are damaged by an ECC module 14.

When the controller 11 determines that the ISP codes and the Info data sectors stored in the first flash memory 12 are not damaged, the controller 11 does not need to determine whether the ISP codes and the Info data sectors stored in the second flash memory 13 are damaged. Furthermore, the controller 11 will directly execute the corresponding operation according to the ISP codes and Info data sectors stored in the first flash memory 12.

When the controller 11 determines that the ISP codes and the Info data sectors stored in the first flash memory 12 are damaged, the controller 11 reads the corresponding ISP code(s) and the corresponding Info data sector(s) stored in the second flash memory 13 to determine whether the ISP code(s) and the Info data sector(s) corresponding to the damaged data of the second flash memory 13 are damaged. When the controller 11 determines that the ISP code(s) and the Info data sector(s) stored in the second flash memory 13 are not damaged, the controller 11 will directly execute the corresponding operation according to the undamaged ISP code(s) and the undamaged Info data sector(s) stored in the second flash memory 13.

When the controller 11 determines that the ISP code(s) and the Info data sector(s) stored in the second flash memory 13 are damaged, the controller 11 produces the correct ISP code(s) and the correct Info data sector(s) according to the ISP codes and Info data sectors stored in the first flash memory 12 and the second flash memory 13.

It should be noted that the step of determining whether the data stored in the first flash memory 12 and the second flash memory 13 are damaged is based on the entire data of the memory, such that the controller 11 can only determine whether the data is damaged without the specifics of the damage. Therefore, the controller 11 will check which of the pages are damaged and produce the correct data according to the undamaged data during the process of producing the correct data.

The embodiments above are illustrated using two flash memories, however, the invention is not limited thereto. A person skilled in the art can use more than two flash memories to store the same ISP codes and Info data sectors to reduce the risk of data damage. The details of using more than two flash memories can be referred to in FIG. 2.

Figure 2:
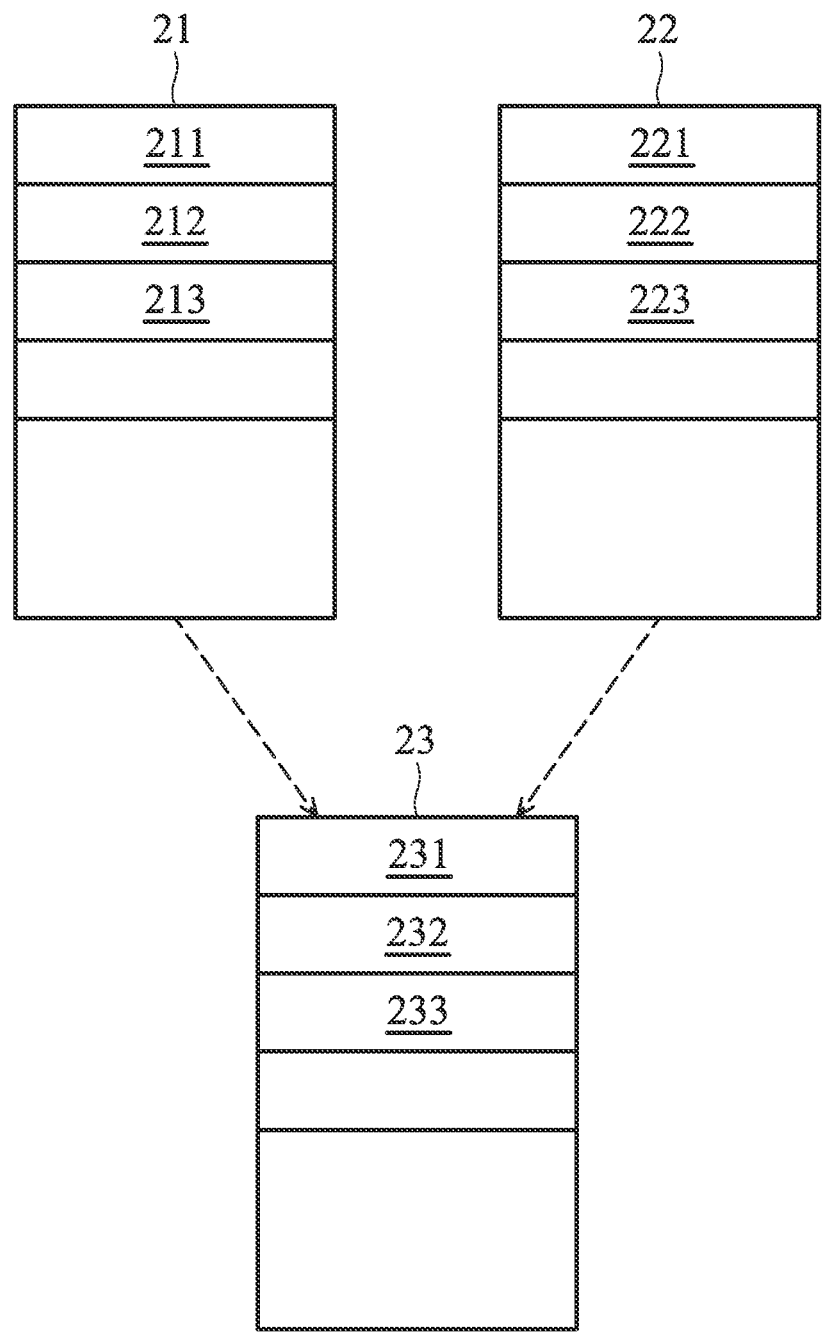
FIG. 2 is a schematic diagram illustrating an embodiment of an operation method of an exemplary embodiment.

FIG. 2 is a schematic diagram illustrating an embodiment of an operation method of an exemplary embodiment. The first flash memory 21 and the second flash memory 22 store the same data, such as ISP codes and Info data sectors, but it is not limited thereto. Person skilled in the art may implement the embodiments in the BIOS, firmware or other files of the electronic device.

In this embodiment, the data stored in the first flash memory 21 and the second flash memory 22 are both damaged, such that the correct data is produced by the undamaged data of the first flash memory 21 and the second flash memory 22. The pages arranged to store the ISP codes and Info data sectors are protected by the error checking and correcting (ECC), and the data of each page can be checked by ECC. The controller checks whether the first page 211, the second page 212 and the third page 213 stored in the first flash memory 21 are damaged. When the check result is that the second page 212 and the third page 213 stored in the first flash memory 21 are not damaged and the first page 211 stored in the first flash memory 21 is damaged, the controller checks whether the first page 221, the second page 222 and the third page 223 stored in the second flash memory 22 are damaged.

When the check result is that the first page 221 and the third page 213 are not damaged and the second page 222 is damaged, the controller stores the data of the first page 221 of the second flash memory 22 into the first page 231 of the third flash memory 23, and stores the data of the second page 212 of the first flash memory 21 into the second page 232 of the third flash memory 23. Furthermore, the controller can selectively store the data which is stored in the third page 213 or the third page 223 into the third page 233 of the third flash memory 23.

In another embodiment, the controller reads the first page 211 of the first flash memory 21 to determine whether the first page 211 of the first flash memory 21 is damaged. When the first page 211 of the first flash memory 21 is damaged, the controller reads the first page 221 of the second flash memory 22 to determine whether the first page 221 of the second flash memory 22 is damaged. The first page 221 of the second flash memory 22 is not damaged, such that the controller stores the data of the first page 221 of the second flash memory 22 into the first page 231 of the third flash memory 23. Next, the controller reads the second page 212 of the first flash memory 21 to determine whether the second page 212 of the first flash memory 21 is damaged. The second page 212 of the first flash memory 21 is not damaged, such that the controller directly stores the data of the second page 212 of the first flash memory 21 into the second page 232 of the third flash memory 23. Next, the controller continues to read the third page 213 of the first flash memory 21 to determine whether the third page 213 of the first flash memory 21 is damaged, and skips the step of reading the second page 222 of the second flash memory 22 to determine whether the second page 222 of the second flash memory 22 is damaged.

Figure 3:
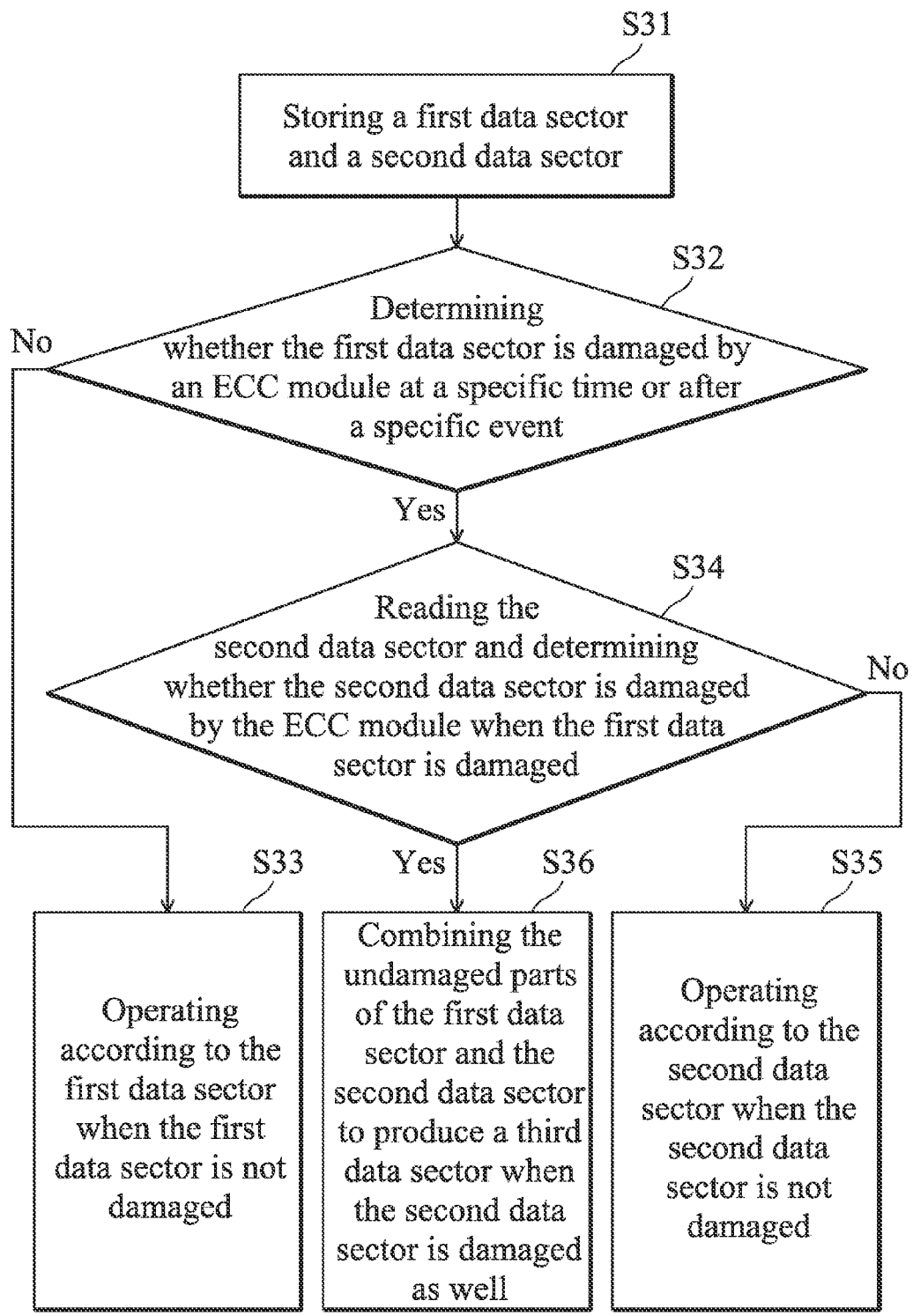
FIG. 3 is a flowchart of an operation of an electronic device according to an exemplary embodiment.

FIG. 3 is a flowchart of an operation of an electronic device according to an exemplary embodiment. In step S31, the controller stores a first data sector and a second data sector, wherein the first data sector and the second data sector are the same; in step S32, the controller determines whether the first data sector is damaged by an ECC module at a specific time or after a specific event; in step S33, the controller operates according to the first data sector when the first data sector is not damaged; in step S34, the controller reads the second data sector and determines whether the second data sector is damaged by the ECC module when the first data sector is damaged; in step S35, the controller operates according to the second data sector when the second data sector is not damaged; in step S36, the controller combines the undamaged parts of the first data sector and the second data sector to produce a third data sector when the second data sector is damaged as well.

It should be noted that the first data sector includes a first ISP code and first Info data sector. The second data sector includes a second ISP code and second Info data sector. The first ISP code and the second ISP code are the same. The first Info data sector and the second Info data sector are the same.

In another embodiment, the step of storing the first and the second data sectors is arranged to store the first data sector in a first flash memory of the electronic device and store the second data sector in a second flash memory of the electronic device, and the first data sector and the second data sector are stored in a plurality of pages of the first flash memory and the second flash memory.

In another embodiment, the step of storing the first and second data sectors is arranged to store the first data sector into a first block of a flash memory of the electronic device, and to store the second data sector into a second block of the flash memory.

Figure 4:
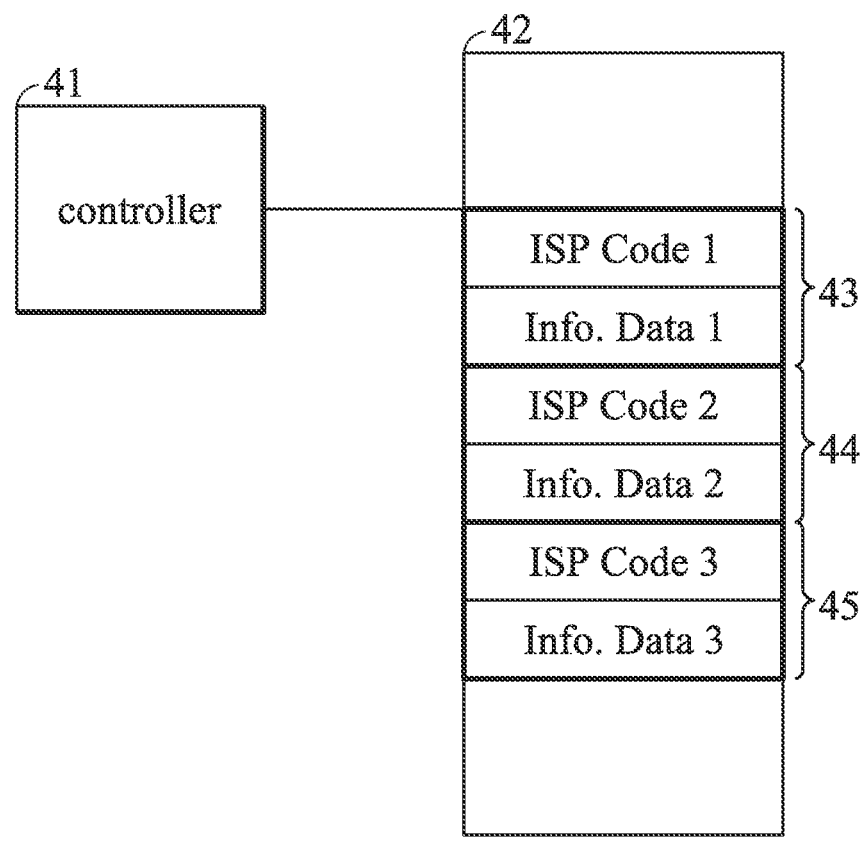
FIG. 4 is a schematic diagram illustrating another embodiment of an electronic device of an exemplary embodiment.

FIG. 4 is a schematic diagram illustrating another embodiment of an electronic device of an exemplary embodiment. FIG. 4 is similar to FIG. 1, except that FIG. 4 only includes one flash memory. The flash memory 42 includes a first system block 43, a second system block 44 and a third system block 45. The controller 41 reads the first ISP code (ISP code 1) and the first Info data sector (Info Data 1) stored in the first system block 43 of the flash memory 42 to determine whether the first ISP code (ISP code 1) and the first Info data sector (Info Data 1) stored in the first system block 43 of the flash memory 42 are damaged at a specific time or after a specific event. In this embodiment, the specific time can be the time that the electronic device is turned on, powered on or returned from the standby mode. In another embodiment, the specific time can be the time after the electronic device is soldered, or reboots after crashing. In this embodiment, the specific event can be the process of soldering the PCB board or the electronic device crashing. It should be noted that the controller 11 reads the first ISP code (ISP code 1) and the first Info data sector (Info Data 1) stored in the first system block 43 of the flash memory 42 to determine whether the first ISP code (ISP code 1) and the first Info data sector (Info Data 1) stored in the first system block 43 of the flash memory 42 are damaged by an ECC module 14.

When the controller 41 determines that the first ISP code (ISP code 1) and the first Info data sector (Info Data sector 1) stored in the first system block 43 are damaged, the controller 41 determines whether both of the first ISP code (ISP code 1) and the first Info data sector (Info Data 1) are damaged or one of the first ISP code (ISP code 1) and the first Info data sector (Info Data 1) is damaged. When the controller determines that only the first ISP code (ISP code 1) is damaged, the controller reads the second ISP code (ISP code 2) stored in the second system block 44 or the third ISP code (ISP code 3) stored in the third system block 45 to determine whether the second ISP code (ISP code 2) stored in the second system block 44 or the third ISP code (ISP code 3) stored in the third system block 45 is damaged. When the second ISP code (ISP code 2) is not damaged, the controller 41 produces a new system block according to the second ISP code (ISP code 2) and the first Info Data sector (Info Data 1).

When the controller 41 determines that both of the first ISP code (ISP code 1) and the first Info data sector (Info Data 1) are damaged, the controller 41 determines whether the data of the second system block 44 and/or the third system block 45 is damaged. When the data of the second system block 44 is not damaged, the controller reads the data of the second system block 44 to execute the corresponding operation. In another embodiment, the controller produces a new system block according to the data of the second system block 44 and the third system block 45.

Data transmission methods, or certain aspects or portions thereof, may take the form of a program code (i.e., executable instructions) embodied in tangible media, such as floppy diskettes, CD-ROMS, hard drives, or any other machine-readable storage medium, wherein, when the program code is loaded into and executed by a machine such as a computer, the machine thereby becomes an apparatus for practicing the methods. The methods may also be embodied in the form of a program code transmitted over some transmission medium, such as electrical wiring or cabling, through fiber optics, or via any other form of transmission, wherein, when the program code is received and loaded into and executed by a machine such as a computer, the machine becomes an apparatus for practicing the disclosed methods. When implemented on a general-purpose processor, the program code combines with the processor to provide a unique apparatus that operates analogously to application-specific logic circuits.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic device, comprising:
   a controller;
   a first flash memory, storing a first data sector; and
   a second flash memory, storing a second data sector, wherein the first data sector and the second data sector are the same, and the first data sector is stored in a plurality of pages of the first flash memory and the second data sector is stored in a plurality of pages of the second flash memory;
   wherein the controller produces a third data sector according to the first data sector and the second data sector to recover the first data sector when the first data sector stored in the first flash memory and the second data stored in the second flash memory are damaged.

2. The electronic device as claimed in claim 1, wherein the controller reads the second data sector stored in the second flash memory when the first data sector is damaged.

3. The electronic device as claimed in claim 2, wherein the controller produces the third data sector after reading the second data sector stored in the second flash memory.

4. The electronic device as claimed in claim 3, wherein the controller produces the third data sector according to undamaged parts of the first data sector and the second data sector.

5. The electronic device as claimed in claim 1, wherein the first data sector includes an ISP code and an info data sector.

6. The electronic device as claimed in claim 1, wherein the controller reads the first data sector stored in the first flash memory to determine whether the first data sector is damaged at a specific time or after a specific event.

7. The electronic device as claimed in claim 6, wherein the controller reads the first data sector stored in the first flash memory to determine whether the first data sector is damaged when the electronic device is powered on.

8. The electronic device as claimed in claim 1, wherein the controller determines whether the first data sector is damaged by an ECC module.

9. An electronic device, comprising:
   a controller; and
   a flash memory, comprising a first block and a second block, the first block stores a first data sector, the second block stores a second data sector that is the same as the first data sector, wherein the controller produces a third data sector according to the first data sector and the second data sector to recover the first data sector when the first data sector and the second data stored are damaged.

10. The electronic device as claimed in claim 9, wherein the controller reads the second data sector stored in the flash memory when the first data sector is damaged.

11. The electronic device as claimed in claim 10, wherein the controller produces the third data sector after reading the second data sector stored in the flash memory.

12. The electronic device as claimed in claim 11, wherein the controller produces the third data sector according to undamaged parts of the first data sector and the second data sector.

13. The electronic device as claimed in claim 9, wherein the first data sector includes an ISP code and an info data sector.

14. The electronic device as claimed in claim 9, wherein the controller reads the first data sector stored in the first flash memory to determine whether the first data sector is damaged at a specific time after a specific event.

15. The electronic device as claimed in claim 14, wherein the controller reads the first data sector stored in the first flash memory to determine whether the first data sector is damaged when the electronic device is powered on.

16. The electronic device as claimed in claim 9, wherein the controller determines whether the first data sector is damaged by an ECC module.

17. A data-management method, applied to an electronic device, comprising:
 storing a first data sector and a second data sector, wherein the first data sector and the second data sector are the same; and
 determining whether the first data sector is damaged at a specific time or after a specific event;
 producing a third data sector according to the first data sector and the second data sector to recover the first data sector when the first data sector and the second data are damaged.

18. The data-management method as claimed in claim 17, further comprising reading the second data sector after the first data sector.

19. The data-management method as claimed in claim 18, further comprising reading the second data sector by an ECC module to determining whether the second data sector is damaged after reading the second data sector.

20. The data-management method as claimed in claim 19, wherein the third data sector is produced after the second data sector is read by the ECC module.

21. The data-management method as claimed in claim 20, wherein the step of producing the third data sector further comprises producing the third data sector according to undamaged parts of the first data sector and the second data sector.

22. The data-management method as claimed in claim 17, wherein the step of storing the first data sector comprises storing the first data sector in a first flash memory of the electronic device, the step of storing the second data sector comprises storing the second data sector in a second flash memory of the electronic device, the first data sector is stored in a plurality of pages of the first flash memory, and the second data sector is stored in a plurality of pages of the second flash memory.

23. The data-management method as claimed in claim 20, wherein the step of storing the first data sector comprises storing the first data sector in a first block of a flash memory of the electronic device, and the step of storing the second data sector comprises storing the second data sector in a second block of the flash memory.

24. The data-management method as claimed in claim 17, wherein the first data sector comprises an ISP code and an info data sector.

* * * * *